(12) United States Patent
Yang et al.

(10) Patent No.: US 10,714,384 B2
(45) Date of Patent: Jul. 14, 2020

(54) SEMICONDUCTOR DEVICE AND MANUFACTURING METHOD THEREOF

(71) Applicant: TAIWAN SEMICONDUCTOR MANUFACTURING COMPANY LIMITED, Hsin-Chu (TW)

(72) Inventors: Ming-Hui Yang, New Taipei (TW); Chun-Ting Liao, Hsinchu (TW); Chen-Yuan Chen, Hsinchu (TW); Ho-Chun Liou, Hsinchu (TW); Yi-Te Chen, Hsinchu (TW)

(73) Assignee: TAIWAN SEMICONDUCTOR MANUFACTURING COMPANY LIMITED, Hsin-chu (TW)

( * ) Notice: Subject to any disclaimer, the term of this patent is extended or adjusted under 35 U.S.C. 154(b) by 0 days.

(21) Appl. No.: 16/532,438

(22) Filed: Aug. 5, 2019

(65) Prior Publication Data
US 2019/0363007 A1  Nov. 28, 2019

Related U.S. Application Data

(62) Division of application No. 14/809,112, filed on Jul. 24, 2015, now Pat. No. 10,373,865.

(51) Int. Cl.
*H01L 21/768* (2006.01)
*H01L 23/00* (2006.01)
*H01L 23/552* (2006.01)
*H01L 23/66* (2006.01)
*H01L 25/065* (2006.01)

(52) U.S. Cl.
CPC ...... *H01L 21/76838* (2013.01); *H01L 23/552* (2013.01); *H01L 23/564* (2013.01); *H01L 23/66* (2013.01); *H01L 25/0655* (2013.01)

(58) Field of Classification Search
CPC ... H01L 25/0655; H01L 23/66; H01L 23/552; H01L 27/0296; H01L 27/0248; H01L 27/0203; H01L 23/585
See application file for complete search history.

(56) References Cited

U.S. PATENT DOCUMENTS

2009/0250783 A1* 10/2009 Nakashiba ........ H01L 21/82387
257/508

* cited by examiner

*Primary Examiner* — Mohammed R Alam
(74) *Attorney, Agent, or Firm* — Cooper Legal Group, LLC

(57) ABSTRACT

A semiconductor device includes an integrated circuit and a guard ring. The integrated circuit includes a first circuit and a second circuit separated from the first circuit. The guard ring is disposed around the first circuit and between the first circuit and the second circuit. The guard ring includes an outer ring, an inner ring, and two connectors. The outer ring is disposed around the first circuit and has a first gap. The inner ring is disposed between the outer ring and the first circuit and has a second gap. The two connectors connect the outer ring and the inner ring. The outer ring, the inner ring, and the two connectors form a closed loop.

20 Claims, 5 Drawing Sheets

SEMICONDUCTOR DEVICE AND MANUFACTURING METHOD THEREOF

RELATED APPLICATION

This application is a divisional of and claims priority to U.S. application Ser. No. 14/809,112, titled "SEMICONDUCTOR DEVICE AND MANUFACTURING METHOD THEREOF" and filed on Jul. 24, 2015, which is incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components of integrated circuits, i.e., transistors, diodes, resistors, capacitors, etc., by continual reductions in minimum feature size, which allow more components to be integrated into a given area. Although dramatic improvements in lithography have resulted in considerable improvement in device formation, there are physical limits to the density that can be achieved. One of these limits is the minimum size needed to make these components. Also, when more devices are put into one chip, more complex designs are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
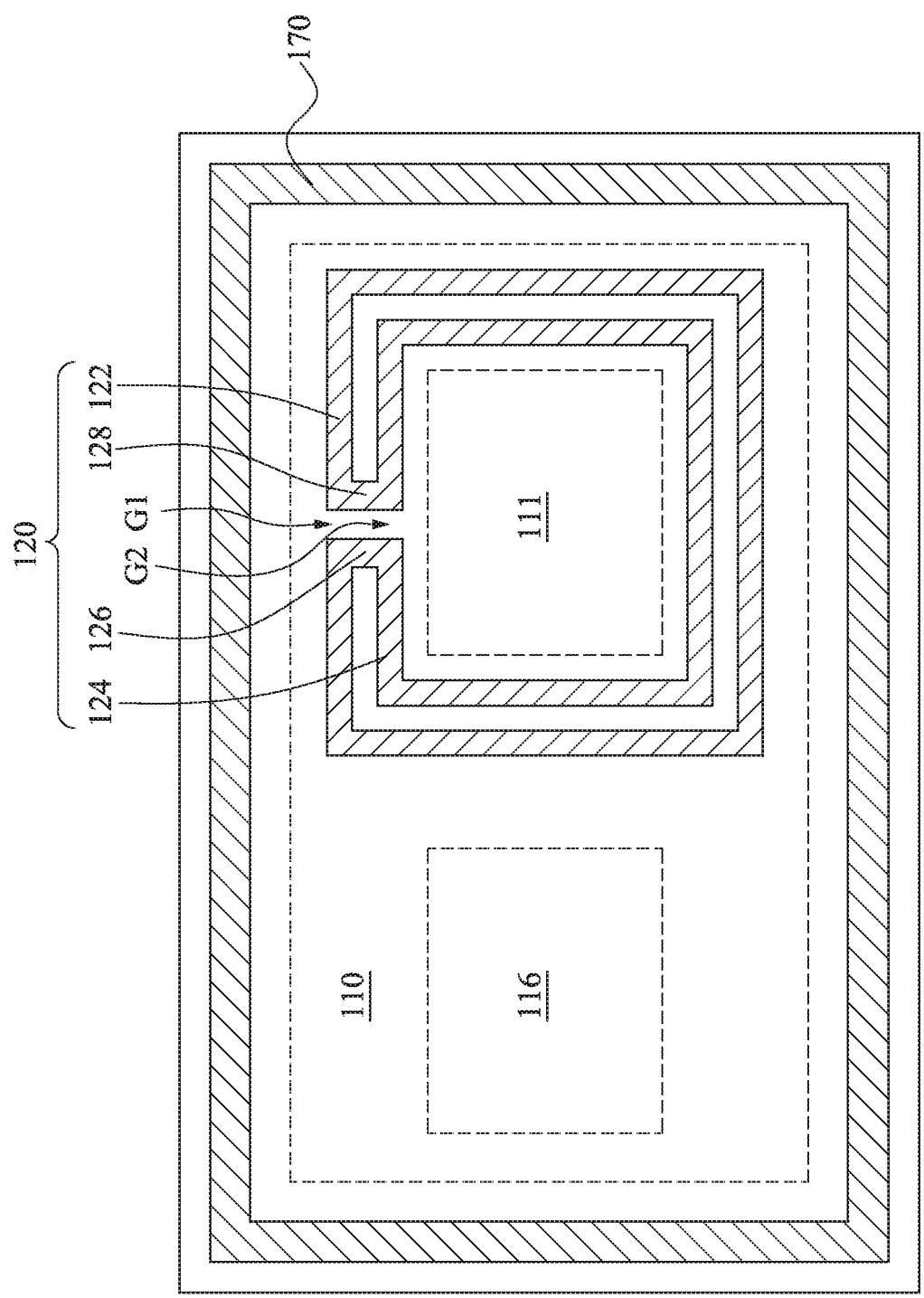
FIG. 1 is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
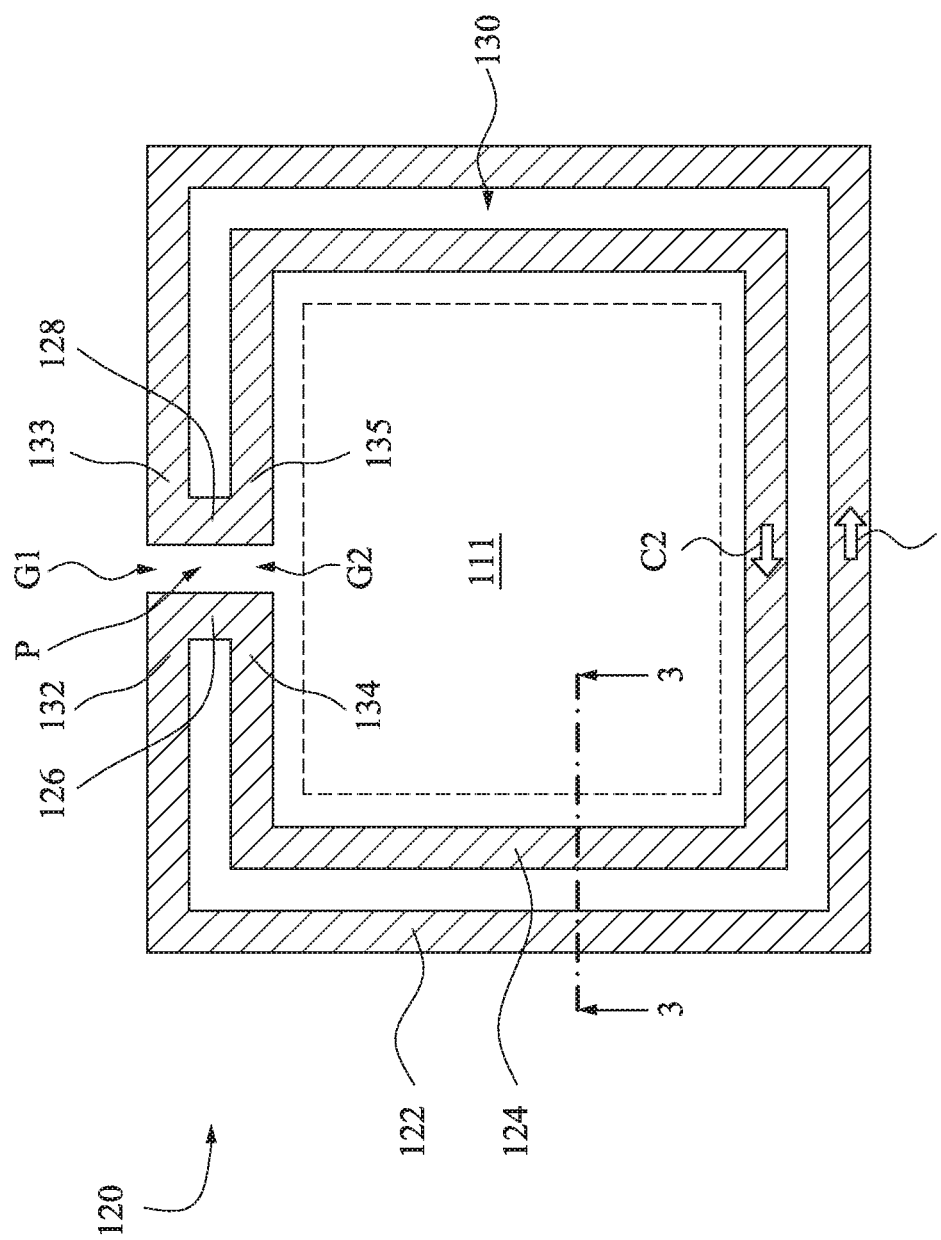
FIG. 2 is a top view of a first circuit and a guard ring of FIG. 1.

A semiconductor device and a method of manufacturing the semiconductor device are provided in accordance with various exemplary embodiments. The variations of the embodiments are discussed. FIG. 1 is a top view of a semiconductor device in accordance with some embodiments of the present disclosure, and FIG. 2 is a top view of a first circuit 111 and a guard ring 120 of FIG. 1. The semiconductor device includes an integrated circuit 110 and a guard ring 120. The integrated circuit 110 includes a first circuit 111 and a second circuit 116 separated from the first circuit 111. As used herein, "circuit" refers to one or more circuits that function independently or in conjunction with each other. The guard ring 120 is disposed around the first circuit 111 and between the first circuit 111 and the second circuit 116. In other words, the guard ring 120 separates the first circuit 111 and the second circuit 116. The guard ring 120 includes an outer ring 122, an inner ring 124, and two connectors 126 and 128. The outer ring 122 is disposed around the first circuit 111 and has a first gap G1. The inner ring 124 is disposed between the outer ring 122 and the first circuit 111, is separated from the outer ring 122, and has a second gap G2. The two connectors 126 and 128 connect the outer ring 122 and the inner ring 124, such that the outer ring 122, the inner ring 124, and the two connectors 126 and 128 form a closed loop. In other words, the two connectors 126 and 128 are separated from each other and respectively connect the outer ring 122 and the inner ring 124 end-to-end to form a continuously loop with the outer ring 122 and the inner ring 124.

As the size of the integrated circuit 110 is reduced, the distance between the first circuit 111 and the second circuit 116 is decreased. That is, the first circuit 111 and the second circuit 116 are disposed close to each other. This configuration may increase the possibility of noise coupling between the first circuit 111 and the second circuit 116, causing crosstalk in the integrated circuit 110. However, in FIG. 1, since the guard ring 120 is disposed around the first circuit 111 and between the first circuit 111 and the second circuit 116, it can block the noise between the first circuit 111 and the second circuit 116, thereby preventing the first circuit 111 from noise coupling with the second circuit 116.

Furthermore, the guard ring 120 formed in a closed loop induces a reverse current for any current resulting from noise to reduce mutual inductance. For example, in FIG. 2, if a first current C1 is induced on the outer ring 122 from radio frequency noise or another source of noise, a second current C2 in the opposite direction (reverse current) is induced in the inner ring 124. The reverse current is induced because the outer ring 122 and the inner ring 124 form a closed loop with the two connectors 126 and 128. The mutual inductance from the opposite currents C1 and C2 is reduced or eliminated because of the opposite direction of induced magnetic fields from the currents C1 and C2. Therefore, the influence of radio frequency noise or another noise source is reduced or eliminated on the integrated circuit 110, and the first circuit 111 and the second circuit 116 can have improved device performances.

In FIG. 2, the first gap G1 and the second gap G2 are substantially aligned with each other. That is, the connector 126 forms a straight line and is substantially perpendicular to the outer ring 122 and the inner ring 124. An angle formed between the connector 126 and the outer ring 122 and an angle formed between the connector 126 and the inner ring 124 are both substantially 90 degrees. Also, the connector 128 forms a straight line and is substantially perpendicular to the outer ring 122 and the inner ring 124. An angle formed between the connector 128 and the outer ring 122 and an angle formed between the connector 128 and the inner ring 124 are both substantially 90 degrees. In some embodiments, however, the connectors 126 and 128 are curved lines such as arcs or any other shapes. In some other embodiments where the gaps G1 and G2 are not aligned, the two connectors 126 and 128 may have different shapes or angles other than straight lines connecting with the outer ring 122 and the inner ring 124.

In FIG. 2, the outer ring 122 further has two first ends 132 and 133 facing the first gap G1, and the inner ring 124 further has two second ends 134 and 135 facing the second gap G2. The first end 132 is near the second end 134 while away from the second end 135, and the first end 133 is near the second end 135 while away from the second end 134. The connector 126 connects the first end 132 and the second end 134, and the connector 128 connects the first end 133 and the second end 135.

Therefore, a path P is formed between the two connectors 126 and 128. The path P extends from a region encircled by the inner ring 124 (i.e., the first circuit 111) to a region outside the outer ring 122 of the guard ring 120. Moreover, the outer ring 122, the inner ring 124, and the two connectors 126 and 128 together form an enclosed region 130. In other words, the enclosed region 130 is encircled by the outer ring 122, the inner ring 124, and the two connectors 126 and 128. The connectors 126 and 128 are disposed between the enclosed region 130 and the path P.

The outer ring 122 and the inner ring 124 have rectangular shapes in FIGS. 1 and 2. In some embodiments, the outer ring 122 and the inner ring 124 have round corners. In some other embodiments, the outer ring 122 and the inner ring 124 have other shapes, such as octagonal shapes. In some embodiments, the outer ring 122 and the inner ring 124 having other shapes have round corners.

In some embodiments, one of the first circuit 111 and the second circuit 116 is an analog circuit, and another one of the first circuit 111 and the second circuit 116 is a digital circuit. For example, the first circuit 111 is an analog circuit, and the second circuit 116 is a digital circuit. Hence, the guard ring 120 can prevent the signal of the analog circuit from penetrating to the digital circuit. In some embodiments, the analog circuit includes combinations of a radio frequency (RF) circuit, an analog baseband circuit, or another type of analog circuit. In some embodiments, the digital circuit includes combinations of a digital signal processing (DSP) circuit, a baseband processing (BBP) circuit, or another type of digital circuit.

In some embodiments, the first circuit 111 and the second circuit 116 may include transistors, logic devices, memory devices, or other types of circuitry. Although two circuits (i.e., the first circuit 111 and the second circuit 116) are shown in FIG. 1, in accordance with some embodiments, three or more circuits are formed on a single integrated circuit, and the claimed scope of the present disclosure is not limited in this respect.

The outer ring 122, the inner ring 124, and the two connectors 126 and 128 include conductive material. In some embodiments, the outer ring 122, the inner ring 124, and the two connectors 126 and 128 include metal, e.g., aluminum (Al), copper (Cu), tin (Sn), nickel (Ni), gold (Au), silver (Ag), or any other suitable material. In some embodiments, the outer ring 122, the inner ring 124, and the two connectors 126 and 128 include multiple layers having metal layers and vias. In some embodiments, a single metal layer can be used instead of multiple layers when the integrated circuit 110 has a single metal layer instead of multiple layers.

Figure 3:
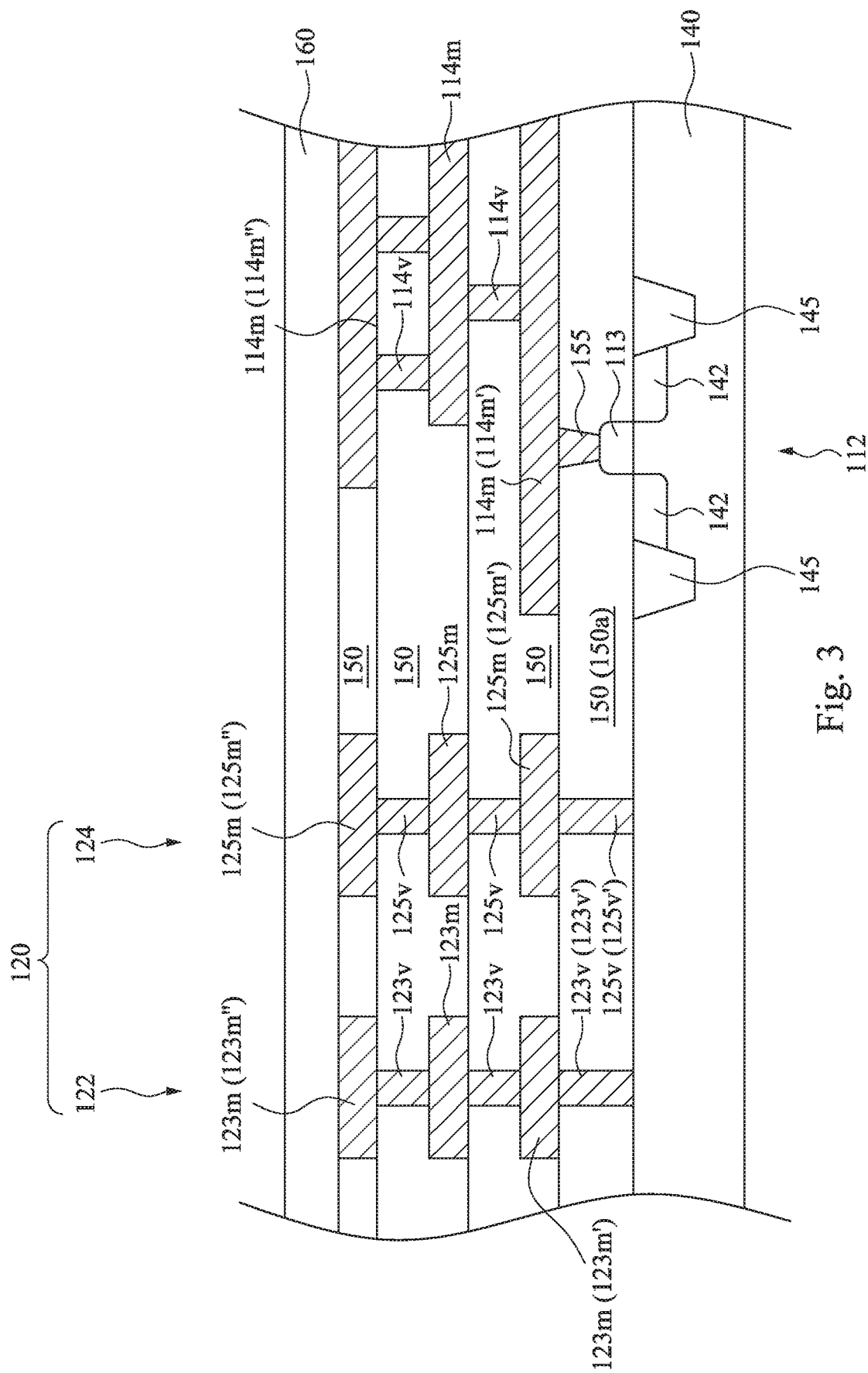
FIG. 3 is a cross-sectional view taking along line 3-3 of FIG. 2.
Figure 4:
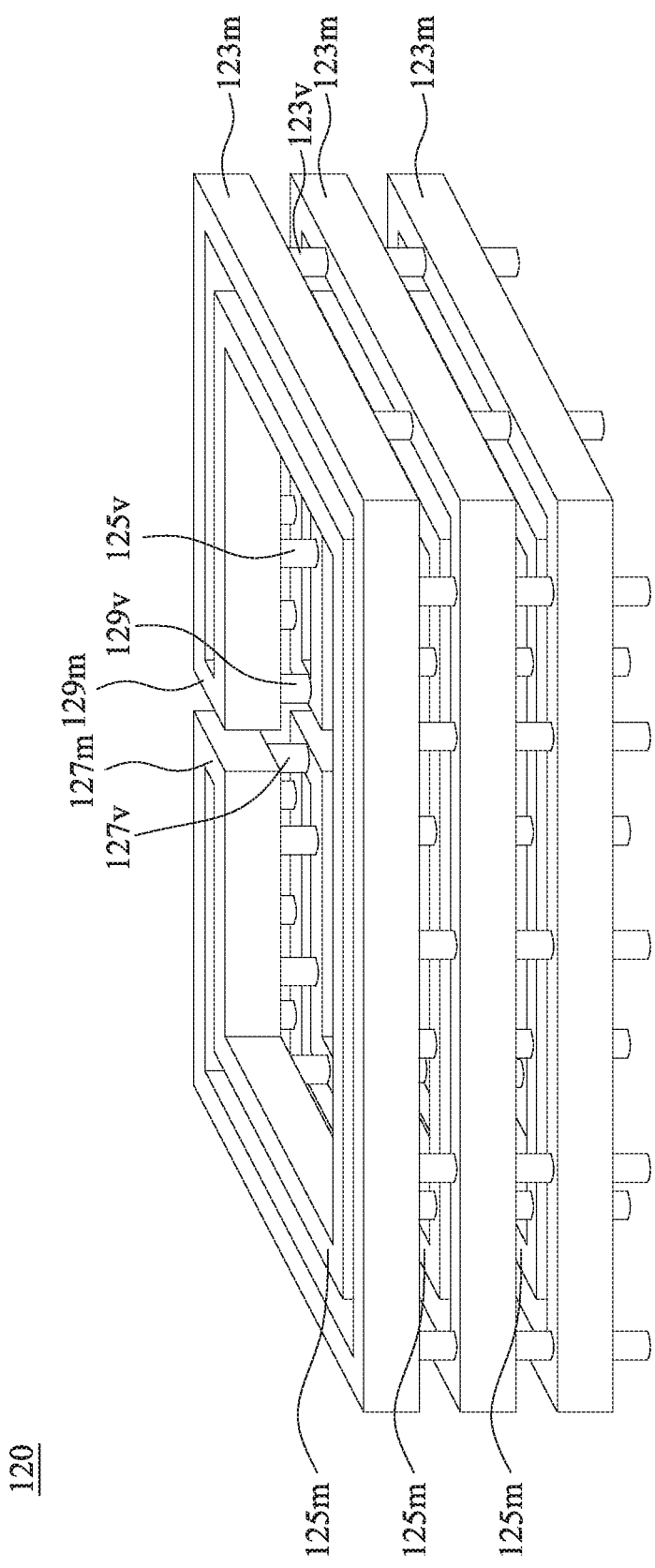
FIG. 4 is a perspective view of the guard ring of FIG. 2.

In greater detail, reference is made to FIGS. 3 and 4. FIG. 3 is a cross-sectional view taking along line 3-3 of FIG. 2, and FIG. 4 is a perspective view of the guard ring 120 of FIG. 2. The semiconductor device may further include a substrate 140. While not shown in the top view (FIG. 2), the integrated circuit 110 (see FIG. 1) may be formed at the surface of the substrate 140. That is, the substrate 140 is disposed beneath the integrated circuit 110 and the guard ring 120. The substrate 140 may be a semiconductor substrate including silicon (Si) or other semiconductor materials and may be covered by an insulating layer, for example. The substrate 140 may also include other active components or circuits, not shown. The substrate 140 may include silicon oxide over single-crystal silicon, for example. The substrate 140 may include semiconductor elements. Compound semiconductors, gallium arsenic (GaAs), indium phosphide (InP), silicon/germanium (Si/Ge), or silicon carbon (SiC), as examples, may be used in place of silicon. The substrate 140 may include a silicon-on-insulator (SOI) or a germanium-on-insulator (GOI) substrate, as examples.

In some embodiments, the first circuit 111 includes a transistor 112. Alternatively, the first circuit 111 may include other types of circuitry. The transistor 112 includes source and drain regions 142 formed within the substrate 140 that are defined at the edges by shallow trench isolation (STI) regions 145. The transistor 112 includes a gate dielectric (not shown) formed over the substrate 140 and between the source and drain regions 142, and a gate 113 is disposed over the gate dielectric.

The semiconductor device further includes a plurality of dielectric layers 150 disposed over the transistor 112 and other active devices (not shown) of the first circuit 111. At least one contact 155 is formed in the bottommost dielectric layer 150a and on the transistor 112. The contact 155 makes electrical contact with the gate 113 of the transistor 112. Other contact (not shown) may also be formed, such as contacts for the source and drain regions 142 of the transistor 112.

Furthermore, the first circuit 111 further includes a plurality of metal layers 114m and vias 114v embedded in the dielectric layers 150. At least one of the metal layers 114m is electrically connected to the contact 155 to provide electrical connections for the first circuit 111. The metal layers 114m and the vias 114v are physically connected. In some embodiments, a passivation layer 160 may cover the outermost metal layer 114m''.

Moreover, the inner ring 124 is also embedded in the dielectric layers 150. In greater detail, the inner ring 124 may extend through the dielectric layers 150. As shown in FIG. 3, the inner ring 124 may further include a plurality of metal layers 125m and a plurality of vias 125v. The metal layers 125m shown in FIG. 3 are plural, and the metal layers 125m may be spaced from each other by one of the dielectric layers 150. In other words, the metal layers 125m and the dielectric layers 150 are alternately stacked. Furthermore, the vias 125v are also plural and positioned between the metal layers 125m. In other words, the vias 125v are disposed in the dielectric layers 150. For example, the metal layer 125m' is separated from the substrate 140 by the dielectric layer 150a. The via 125v' is positioned between the metal layer 125m' and the substrate 140. The metal layers 125m and the vias 125v are physically connected. In some embodiments, the passivation layer 160 may cover the outermost metal layer 125m''.

Furthermore, the outer ring 122 is also embedded in the dielectric layers 150. In greater detail, the outer ring 122 may extend through the dielectric layers 150. As shown in FIG. 3, the outer ring 122 may further include a plurality of metal layers 123m and a plurality of vias 123v. The metal layers 123m shown in FIG. 3 are plural, and the metal layers 123m may be spaced from each other by one of the dielectric layers 150. In other words, the metal layers 123m and the dielectric layers 150 are alternately stacked. Furthermore, the vias 123v are also plural and positioned between the metal layers 125m. In other words, the vias 123v are disposed in the dielectric layers 150. For example, the metal layer 123m' is separated from the substrate 140 by the dielectric layer 150a. The via 123v' is positioned between the metal layer 123m' and the substrate 140. The metal layers 123m and the vias 123v are physically connected. In some embodiments, the passivation layer 160 may cover the outermost metal layer 123m''.

Furthermore, as shown in FIGS. 2 and 4, the connectors 126 and 128 can have the similar configurations (a structure formed of metal layers 127m, 129m and vias 127v, 129v disposed on the substrate 140 of FIG. 3), and a description in this regard will not be repeated hereinafter.

In FIG. 4, the metal layers 123m and 125m are discontinuous loops. That is, the metal layers 123m and 125m have gaps. The gaps of the metal layers 123m form the first gap G1 in FIG. 2, and the gaps of the metal layers 125m form the second gap G2 in FIG. 2. The metal layers 123m, 125m, 127m, and 129m at the same level can be integrally formed, so as to form a closed loop, as shown in FIG. 4, and the claimed scope of the present disclosure is not limited in this respect.

Reference is made to FIGS. 3 and 4. The metal layers 114m, 123m, 125m, 127m, 129m and the vias 114v, 123v, 125v, 127v, 129v may be made of aluminum (Al), copper (Cu), tin (Sn), nickel (Ni), gold (Au), silver (Ag), or combinations thereof. The dielectric constant of the dielectric layers 150 may be between about 1 and about 4.2. For example, the dielectric layers 150 may be made of fluorinated silicate glass, carbon doped oxide, fluorinate amorphous carbon, hydrogenated amorphous carbon, hydrogenated silsesquioxane, poly(arylene ethers), cyclotene, silicone oxide aerogel or silicone oxide xerogel. Alternatively, the dielectric layers 150 may include other materials and dimensions. For example, the dielectric layers 150 may include an extra low k (ELK) material having a dielectric constant or k value of about 2.5 or less, as another example.

Some of these materials have a low structural strength, and the guard ring 120 disposed proximate the perimeter of the first circuit 111 can provide increased structural support and robustness for the semiconductor device. The guard ring 120 also prevents or reduces the likelihood of delamination of the dielectric layers 150, for example. Furthermore, the dielectric layers 150 may be formed by spin coating or chemical vapor deposition. It is noted that although there are three levels of the metal layers 114m, 123m, 125m, 127m, and 129m in FIGS. 3 and 4, the claimed scope of the present disclosure is not limited in this respect. A person having ordinary skill in the art may select a suitable number of levels for the metal layers 114m, 123m, 125m, 127m, and 129m according to actual situations.

Reference is made to FIG. 1. The semiconductor device further includes at least one seal ring 170 disposed around the integrated circuit 110. That is, the seal ring 170 disposed around both the first circuit 111 and the second circuit 116. The seal ring 170 can provide structural reinforcement, stop undesirable moisture and mobile ionic contaminants from entering the integrated circuit 110 and affecting operational reliability, and also serve as a die saw crack stopper. In some embodiments, the seal ring 170 is a closed loop. In some embodiments, the seal ring 170 has at least one gap disposed therein. The gap results in the break of a noise-coupling path. In some other embodiments, there are more than one seal rings separated from each other and disposed around the integrated circuit 110. The cross-sectional view of the seal ring may have the similar configurations to the cross-sectional view of the guard ring 120, and the claimed scope of the present disclosure is not limited in this respect.

Figure 5:
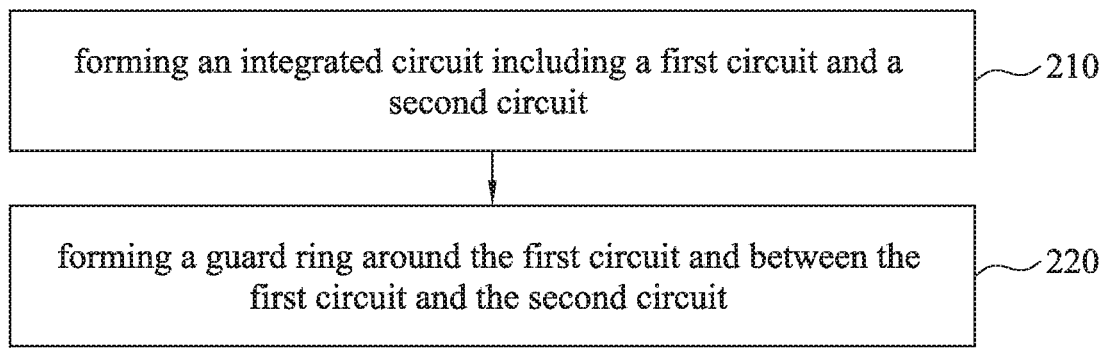
FIG. 5 is a flowchart for a method of forming a semiconductor device in accordance with some embodiments of the present disclosure.

FIG. 5 is a flowchart for a method of forming a semiconductor device in accordance with some embodiments of the present disclosure. At operation 210, an integrated circuit including a first circuit and a second circuit is formed. As used herein, "circuit" refers to one or more circuits that function independently or in conjunction with each other. The first circuit and the second circuit are separated from each other. At operation 220, a guard ring is formed around the first circuit and between the first circuit and the second circuit. The integrated circuit and the guard ring can be formed on a substrate. In some embodiments, the substrate may be a semiconductor substrate including silicon or other semiconductor materials and may be covered by an insulating layer.

In some embodiments, one of the first circuit and the second circuit is an analog circuit, and another one of the first circuit and the second circuit is a digital circuit. For example, the first circuit is an analog circuit, and the second circuit is a digital circuit. Hence, the guard ring can prevent the signal of the analog circuit from penetrating to the digital circuit. In some embodiments, the analog circuit includes combinations of a radio frequency (RF) circuit, an analog baseband circuit, or another type of analog circuit. In some embodiments, the digital circuit includes combinations of a digital signal processing (DSP) circuit, a baseband processing (BBP) circuit, or another type of digital circuit.

In some embodiments, the first circuit and the second circuit may include transistors, logic devices, memory devices, or other types of circuitry. Although two circuits (i.e., the first circuit and the second circuit) are mentioned in FIG. 5, in accordance with some embodiments, three or more circuits are formed on a single integrated circuit, and the claimed scope of the present disclosure is not limited in this respect.

Figure 6:
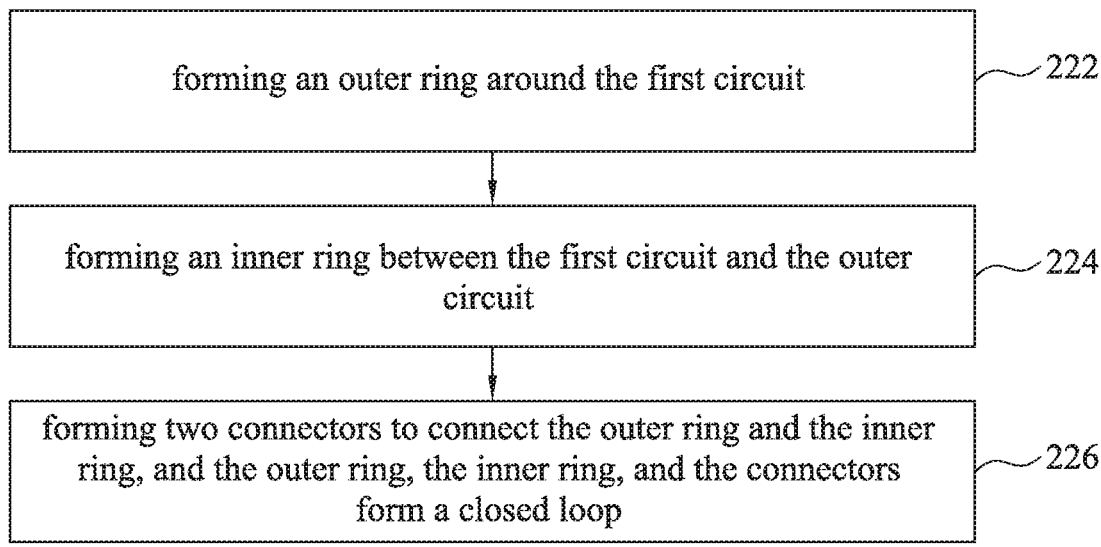
FIG. 6 is a flow chart of operation 220 of FIG. 5.

FIG. 6 is a flow chart for the operation 220 of FIG. 5. At operation 222, an outer ring is formed around the first circuit. The outer ring has a first gap, such that the outer ring surrounds the first circuit discontinuously. At operation 224, an inner ring is formed between the first circuit and the outer ring. The inner ring is separated from the outer ring. The inner ring has a second gap, such that the inner ring surrounds the integrated circuit discontinuously. At operation 226, two connectors are formed to connect the outer ring and the inner ring, such that the outer ring, the inner ring, and the two connectors form a closed loop.

Even though the flowchart is shown with multiple steps in an order, the steps can be implemented with different orders or simultaneously with each other. For example, a metal layer can be deposited for the outer ring, the inner ring, and the two connectors simultaneously. For another example, the outer ring, the inner ring, and the two connectors are formed simultaneously with the integrated circuit. Therefore, there is no extra mask is used, no extra process is added, such that the manufacturing cost can be reduced.

In various embodiments, the outer ring, the inner ring, and the two connectors include electrically conductive material or metal such as aluminum (Al), copper (Cu), tin (Sn), nickel (Ni), gold (Au), silver (Ag), or combinations thereof. In some embodiments, the outer ring, the inner ring, and the two connectors include multiple layers, e.g., metal layers and vias. The metal layers and the vias can include any suitable material and be formed or fabricated using any suitable methods or processes known in the art. For example, the metal layers include aluminum (Al), copper (Cu), tin (Sn), nickel (Ni), gold (Au), silver (Ag), or combinations thereof, and can be deposited using electroplating, physical vapor deposition (PVD), sputtering, or any other suitable process and defined by etching. The vias may include cupper (Cu), Cu alloy, tungsten (W), gold (Au), aluminum (Al), or any other suitable material in some embodiments. The contacts can be formed by PVD, chemical vapor deposition (CVD), and chemical-mechanical planarization (CMP), for example.

In some embodiments, at least one seal ring is formed around the integrated circuit to provide structural reinforcement, stop undesirable moisture and mobile ionic contaminants from entering the integrated circuit and affecting operational reliability, and also serve as a die saw crack stopper. The seal ring can be made of conductive materials, such as metal. The configuration of the seal ring can be similar to the guard ring, and the claimed scope of the present disclosure is not limited in this respect. In some embodiments, the seal ring is formed simultaneously with the integrated circuit and the guard ring.

According to the aforementioned embodiments, since the guard ring is disposed around the first circuit and between the first circuit and the second circuit, it can block the noise between the first circuit and the second circuit, thereby preventing the first circuit from noise coupling with the second circuit. Furthermore, the guard ring formed in a closed loop induces a reverse current for any current resulting from noise to reduce mutual inductance. The mutual inductance from opposite currents formed in the outer ring and the inner ring is reduced or eliminated because of the opposite direction of induced magnetic fields from the currents. Therefore, the influence of radio frequency noise or another noise source is reduced or eliminated on the integrated circuit.

According to some embodiments, a semiconductor device includes an integrated circuit and a guard ring. The integrated circuit includes a first circuit and a second circuit separated from the first circuit. The guard ring is disposed around the first circuit and between the first circuit and the second circuit. The guard ring includes an outer ring, an inner ring, and two connectors. The outer ring is disposed around the first circuit and has a first gap. The inner ring is disposed between the outer ring and the first circuit and has a second gap. The two connectors connect the outer ring and the inner ring. The outer ring, the inner ring, and the two connectors form a closed loop.

According to some embodiments, a semiconductor device includes an integrated circuit and a guard ring. The integrated circuit includes a first circuit and a second circuit. The guard ring is disposed around the first circuit and separates the first circuit and the second circuit. The guard ring includes an outer ring, an inner ring, and two connectors. The outer ring is disposed around the first circuit and has a first gap. The inner ring is disposed between the outer ring and the first circuit, is separated from the outer ring, and has a second gap. The two connectors are separated from each other and respectively connect the outer ring and the inner ring end-to-end to form a continuously loop with the outer ring and the inner ring.

According to some embodiments, a method for manufacturing a semiconductor device includes forming an integrated circuit including a first circuit and a second circuit separated from the first circuit. A guard ring is formed around the first circuit and between the first circuit and the second circuit, including forming an outer ring around the first circuit. An inner ring is formed between the first circuit and the outer ring. Two connectors are formed to connect the outer ring and the inner ring. The outer ring, the inner ring, and the two connectors form a closed loop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming an integrated circuit comprising a first circuit and a second circuit separated from the first circuit;
   forming a first dielectric layer over the first circuit and the second circuit;
   forming a first metal layer comprising a first metal portion, a second metal portion, a third metal portion, a fourth metal portion, and a fifth metal portion over the first dielectric layer, wherein:
   the fifth metal portion is coupled to the first circuit,
   the first metal portion surrounds the fifth metal portion to define an inner ring,
   the second metal portion surrounds the first metal portion to define an outer ring,
   the third metal portion extends between the first metal portion and the second metal portion to define a first connector,
   the fourth metal portion extends between the first metal portion and the second metal portion to define a second connector, and the inner ring, the outer ring, the first connector, and the second connector define an electrically conductive path; and forming a second dielectric layer over the first metal layer, wherein:
the second dielectric layer isolates the fifth metal portion from the first metal portion, the second metal portion, the third metal portion, and the fourth metal portion, and
the second dielectric layer is disposed between a sidewall of the first connector and a sidewall of the second connector facing the sidewall of the first connector.

2. The method of claim 1, comprising:
forming a first via contacting the first metal portion and extending through the first dielectric layer.

3. The method of claim 2, comprising:
forming a second via contacting the second metal portion and extending through the first dielectric layer, wherein the second via is separated from the first via by the first dielectric layer.

4. The method of claim 3, comprising:
forming a contact extending through the first dielectric layer, wherein:
the contact contacts a gate of the first circuit, and
the contact is separated from the first via and the second via by the first dielectric layer.

5. The method of claim 1, wherein the first metal portion and the second metal portion are between the first circuit and the second circuit.

6. The method of claim 1, wherein the third metal portion intersects the first metal portion at a 90 degree angle.

7. The method of claim 6, wherein the third metal portion intersects the second metal portion at a 90 degree angle.

8. The method of claim 1, wherein:
one of the first circuit or the second circuit is an analog circuit, and
one of the first circuit or the second circuit is a digital circuit.

9. The method of claim 1, wherein the first metal layer comprises at least one of aluminum, copper, tin, nickel, gold, or silver.

10. The method of claim 1, wherein forming the first metal layer comprises:
forming a first sub-layer of the first metal layer using a first material; and
forming a second sub-layer of the first metal layer using a second material different than the first material.

11. The method of claim 1, comprising:
forming a second metal layer over the second dielectric layer, wherein:
the second metal layer comprises a sixth metal portion and a seventh metal portion,
the sixth metal portion is over the fifth metal portion and is electrically coupled to the fifth metal portion, and
the seventh metal portion is over the first metal portion and is electrically coupled to the first metal portion.

12. The method of claim 11, comprising:
forming a passivation layer in contact with a top surface of the sixth metal portion and a top surface of the seventh metal portion.

13. The method of claim 12, comprising:
forming a third dielectric layer between the sixth metal portion and the seventh metal portion prior to forming the passivation layer.

14. A method for manufacturing a semiconductor device, comprising:
forming an integrated circuit comprising a first circuit and a second circuit separated from the first circuit;
forming a first portion of a first metal layer over the first circuit;
forming a first via over the first portion of the first metal layer;
forming a first portion of a second metal layer over the first via, wherein the first portion of the second metal layer is electrically coupled to the first portion of the first metal layer by the first via;
forming a guard ring around the first portion of the first metal layer and the first portion of the second metal layer and between the first circuit and the second circuit, wherein forming the guard ring comprises:
forming an outer ring around the first circuit, wherein the outer ring has a first gap;
forming an inner ring between the outer ring and the first circuit, wherein the inner ring has a second gap; and
forming two connectors connecting the outer ring and the inner ring, wherein:
the outer ring, the inner ring, and the two connectors form a closed loop, and
forming at least one of the outer ring or the inner ring comprises:
forming a second portion of the first metal layer;
forming a plurality of vias spaced apart from each other over the second portion of the first metal layer; and
forming a second portion of the second metal layer over the plurality of vias, wherein the second portion of the second metal layer is electrically coupled to the second portion of the first metal layer by the plurality of vias; and
forming a passivation layer in contact with a top surface of the first portion of the second metal layer and a top surface of the second portion of the second metal layer.

15. The method of claim 14, comprising:
forming a dielectric layer separating each via of the plurality of vias from other vias of the plurality of vias.

16. The method of claim 14, wherein forming the first portion of the first metal layer over the first circuit, comprises:
forming a first sub-layer of the first metal layer using a first material; and
forming a second sub-layer of the first metal layer using a second material different than the first material.

17. The method of claim 14, comprising:
forming a dielectric layer separating the first portion of the second metal layer from the second portion of the second metal layer, wherein forming the passivation layer comprises forming the passivation layer to contact a top surface of the dielectric layer.

18. A method for manufacturing a semiconductor device comprising:
forming an integrated circuit comprising a first circuit and a second circuit that are formed in a substrate, wherein a first portion of the substrate defines a body portion of a transistor of the first circuit; and
forming a guard ring around the first circuit and separating the first circuit from the second circuit, wherein forming the guard ring comprises:
forming an outer ring around the first circuit, wherein the outer ring has a first gap;

forming an inner ring between the outer ring and the first circuit, wherein the inner ring has a second gap; and forming two connectors separated from each other and respectively connecting the outer ring and the inner ring end-to-end to form a continuous loop with the outer ring and the inner ring, wherein:

the outer ring, the inner ring, and the two connectors together form an enclosed region, the enclosed region separates the first circuit from the second circuit, at least one of the outer ring, the inner ring, or at least one of the two connectors are in contact with a second portion of the substrate, and the second portion of the substrate has a same composition as the first portion of the substrate.

19. The method of claim 18, wherein the outer ring and the inner ring have a same material composition.

20. The method of claim 18, wherein forming the guard ring comprises forming the guard ring entirely above the substrate.

\* \* \* \* \*